United States Patent
Song et al.

(10) Patent No.: US 9,201,180 B2
(45) Date of Patent: Dec. 1, 2015

(54) COLOR FILTER ARRAY AND IMAGE OBTAINING APPARATUS

(75) Inventors: Hyun-Chul Song, Seoul (KR); Won-Hee Choe, Hwaseong-si (KR); Seong-Deok Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 61 days.

(21) Appl. No.: 12/973,835

(22) Filed: Dec. 20, 2010

(65) Prior Publication Data

US 2011/0155908 A1   Jun. 30, 2011

(30) Foreign Application Priority Data

Dec. 24, 2009   (KR) .................... 10-2009-0130399

(51) Int. Cl.
  *G02F 1/1335*   (2006.01)
  *G02B 5/22*   (2006.01)
  *G02B 5/20*   (2006.01)
  *H01L 27/146*   (2006.01)

(52) U.S. Cl.
  CPC .......... *G02B 5/201* (2013.01); *G02F 1/133514* (2013.01); *H01L 27/14621* (2013.01)

(58) Field of Classification Search
  CPC .............. G02F 1/1335; G02F 1/13394; G02F 1/133514; G02B 5/20; G02B 2/201
  USPC ........... 359/891; 349/106, 108, 143; 348/271, 348/276, 277; 345/55
  See application file for complete search history.

(56) References Cited

U.S. PATENT DOCUMENTS

| | | | |
|---|---|---|---|
| 5,444,557 A * | 8/1995 | Spitzer et al. | 349/42 |
| 6,714,243 B1 | 3/2004 | Mathur et al. | |
| 7,095,441 B2 * | 8/2006 | Nagano | 348/308 |
| 7,259,812 B2 * | 8/2007 | Park et al. | 349/106 |
| 7,564,530 B2 * | 7/2009 | Hu et al. | 349/143 |
| 7,719,780 B2 * | 5/2010 | Wang et al. | 359/891 |
| 7,876,350 B2 * | 1/2011 | Shin et al. | 348/51 |
| 7,880,785 B2 * | 2/2011 | Gallagher | 348/276 |
| 2007/0187794 A1 | 8/2007 | Fukuyoshi et al. | |
| 2008/0272987 A1 * | 11/2008 | Lee et al. | 345/55 |

FOREIGN PATENT DOCUMENTS

| | | |
|---|---|---|
| JP | 57-24182 | 2/1982 |
| JP | 62-38692 | 2/1987 |
| JP | 8-23542 | 1/1996 |
| JP | 8-23543 | 1/1996 |
| JP | 2003-318375 | 11/2003 |
| JP | 2007/049224 | 2/2007 |
| KR | 10-2006-0128240 | 12/2006 |

* cited by examiner

*Primary Examiner* — Audrey Y Chang
(74) *Attorney, Agent, or Firm* — NSIP Law (57) ABSTRACT

A color filter array and image obtaining apparatus are provided. The color filter array includes at least one unit cell having a predetermined array of pixels, and the predetermined array including the color pixels and transparent pixels. Each 2×2 array of pixels in the unit cell includes one transparent pixel and three color pixels and at least one transparent pixel is located in each row or in each column of the unit cell. The image obtaining apparatus generate an electrical image signal corresponding to sensed light that has passed through the color filter array.

2 Claims, 6 Drawing Sheets

COLOR FILTER ARRAY AND IMAGE OBTAINING APPARATUS

CROSS-REFERENCE TO RELATED APPLICATION(S)

This application claims the benefit under 35 U.S.C. §119 (a) of Korean Patent Application No. 10-2009-0130399, filed on Dec. 24, 2009, in the Korean Intellectual Property Office, the entire disclosure of which is incorporated herein by reference for all purposes.

BACKGROUND

1. Field

The following description relates to a color filter array used in an image sensor and an image obtaining apparatus.

2. Description of the Related Art

Generally, a color filter array refers to a mosaic of color filters placed on an image sensor which filter light by wavelength range to capture color information.

A typical example of a design pattern of the color filter array is a Bayer pattern. The Bayer pattern is composed of grids, each consisting of two columns and two rows. In a 2×2 grid, a red pixel and a green pixel (RG) and a green pixel and a blue pixel (GB) are arranged. That is, the Bayer pattern has contiguous RG pixels and GP pixels.

The Bayer pattern allows rich color representation since it can obtain primary colors without processing. The Bayer pattern may consist of color pixels and white pixels.

The color filter array with the white pixel includes a transparent pixel in a 2×2 grid. The transparent pixel allows the sensitivity with regards to a captured image to be improved.

SUMMARY

In one general aspect there is provided a color filter array, including: at least one unit cell including a predetermined array of pixels, the predetermined array including color pixels and transparent pixels, each 2×2 array of pixels in the unit cell including one transparent pixel and three color pixels, at least one transparent pixel being located in each row or in each column of the unit cell.

The color filter array may further include that the unit cell includes a 2×4 array of pixels or a 4×2 array of pixels.

The color filter array may further include that the three color pixels in the 2×2 array of pixels include: a red pixel configured to pass red light, a green pixel configured to pass green light, and a blue pixel configured to pass blue light.

The color filter array may further include that the three color pixels in the 2×2 array of pixels include: a cyan pixel configured to pass cyan light, a magenta pixel configured to pass magenta light, and a yellow pixel configured to pass yellow light.

The color filter array may further include that the color filter array is formed by repeatedly arranging a plurality of the unit cells.

The color filter array may further include a plurality of unit cells.

In another general aspect, there is provided a color filter array, including: at least one unit cell including a predetermined array of pixels, the predetermined array including color pixels and transparent pixels, a predetermined 2×2 array of pixels in the unit cell including one transparent pixel and three color pixels, at least one transparent pixel being located in each row and each column of the unit cell.

The color filter array may further include that the unit cell includes a 4×4 array of pixels.

The color filter array may further include that the three color pixels included in the 2×2 array of pixels include: a red pixel configured to pass red light, a green pixel configured to pass green light, and a blue pixel configured to pass blue light.

The color filter array may further include that the three color pixels in the 2×2 array of pixels include: a cyan pixel configured to pass cyan light, a magenta pixel configured to pass magenta light, and a yellow pixel configured to pass yellow light.

The color filter array may further include that the color filter array is formed by repeatedly arranging a plurality of the unit cells.

The color filter array may further include a plurality of unit cells.

In another general aspect, there is provided an image obtaining apparatus, including: a first layer configured to: detect light that passed through color pixels of a color filter array, and generate a color signal corresponding to the detected light, and a second layer configured to: detect infrared light that passed through a transparent pixel of the color filter array, and generate an infrared signal corresponding to the detected infrared light, wherein the image obtaining apparatus is configured to generate an electrical image signal corresponding to the sensed light.

The image obtaining apparatus may further include that the generated image signal may include a plurality of sub-channel signals.

The image obtaining apparatus may further include that the color filter array includes at least one unit cell including a predetermined array of pixels, the predetermined array including the color pixels and transparent pixels, each 2×2 array of pixels in the unit cell including one transparent pixel and three color pixels, at least one transparent pixel being located in each row or in each column of the unit cell.

In still another general aspect, there is provided a color filter array including at least one unit cell including a first transparent pixel which is located in a third column in a first row, a second transparent pixel which is located in a second column in a second row, a third transparent pixel which is located in a first column in a third row, and a fourth transparent pixel which is located in a fourth column in a fourth row.

The unit cell further may include at least one color pixel, a ratio of each pixel to a total number of pixels is ¼.

Other features and aspects may be apparent from the following detailed description, the drawings, and the claims.

BRIEF DESCRIPTION OF THE DRAWINGS

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

Figure 1:
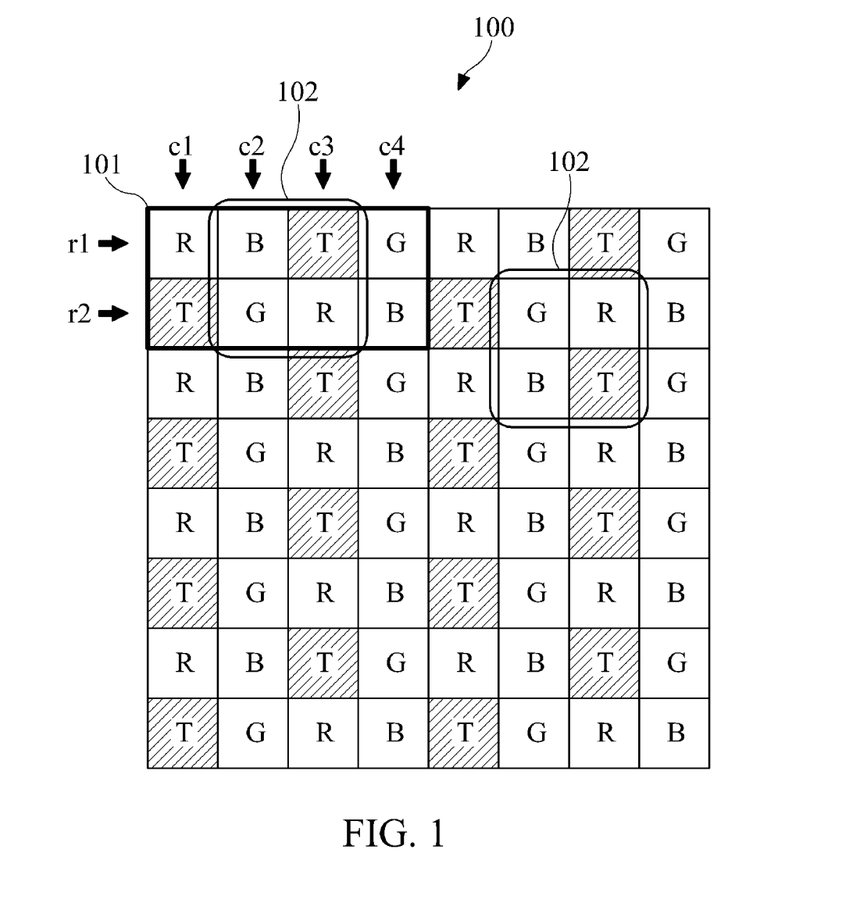
FIG. 1 is a diagram illustrating an example of a color filter array.

FIG. 1 illustrates an example of a color filter array. Referring to the example of FIG. 1, the color filter array 100 may be formed by repeatedly arranging a plurality of identical unit cells 101.

Each unit cell 101 includes color pixels R, G, and B and transparent pixels T. Each of the color pixels R, G, and B selectively passes light within a specific wavelength band. For example, the color pixels R, G, and B are configured to include a red pixel R to pass red light, a green pixel G to pass green light and a blue pixel B to pass blue light. In addition, although not illustrated in detail, the color pixels R, G, and B may include a cyan pixel C to pass cyan light, a magenta pixel M to pass magenta light, and a yellow pixel Y to pass yellow light.

The transparent pixel T may pass light within all wavelength ranges. For example, the transparent pixel T may pass white light. In addition, the transparent pixel T may pass or block infrared light IR.

In the example shown in FIG. 1, each unit cell 101 includes a 2×4 array, which has two rows and four columns. The 2×4 array includes eight pixels (for example, R, G, B, and T) arranged in two rows and four columns. For example, the unit cell 101 may include two rows r1 and r2 and four columns c1, c2, c3, and c4.

Further, in the example illustrated in FIG. 1, a predetermined window 102 is set in the unit cell 101. The window 102 may include two pixels in a row and two pixels in a column. The pixels in the window 102 are one transparent pixel P and three different color pixels R, G, and B. Referring to the example in FIG. 1, the window 102 includes one transparent pixel T, regardless of position, and three different color pixels R, G, and B regardless of its position in the color filter array.

Referring to FIG. 1 again, each of the rows r1 and r2 in the unit cell 101 includes at least one transparent pixel T. For example, in the first row r1, a transparent pixel T may be positioned on the third column c3, and in the second row r2, a transparent pixel T may be placed on the first column c1. That is, the transparent pixel T appears at least once in each row r1 and r2 of the unit cell 101.

Thus, the color filter array 100, which may be designed to include the unit cells 101 arranged horizontally and vertically, may improve the resolution and sensitivity of an image, as each row of the color filter array 100 includes at least one or more transparent pixels T and any 2×2 array in the color filter array 100 includes both the transparent pixel T and the color pixels for obtaining light of the three primary colors.

Figure 2:
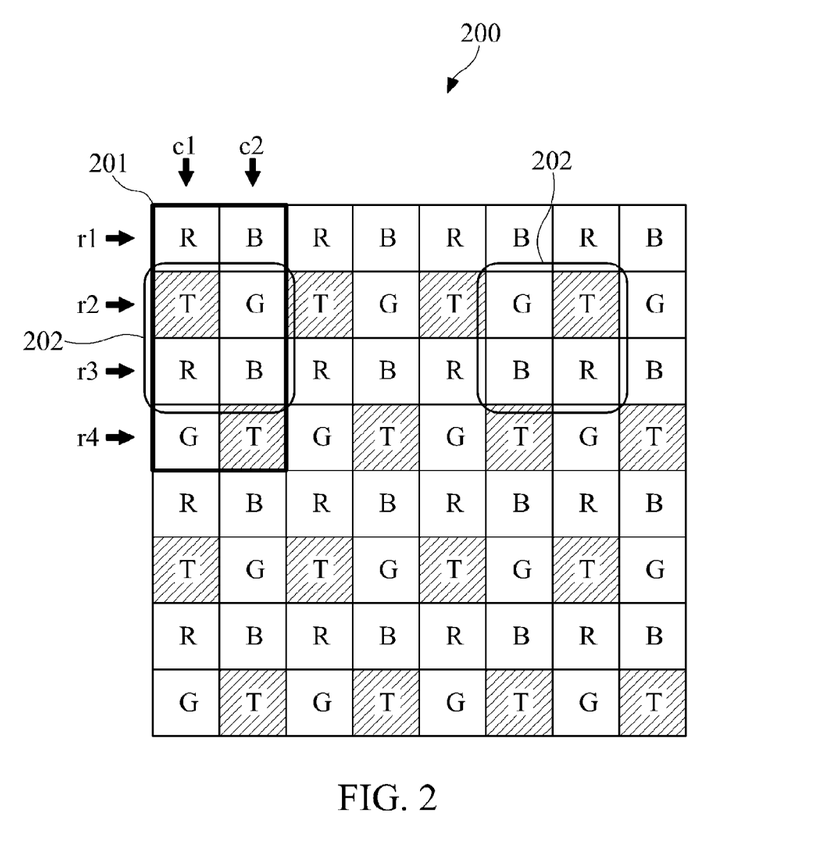
FIG. 2 is a diagram illustrating another example of a color filter array.

FIG. 2 illustrates another example of a color filter array. Referring to FIG. 2, the color filter array 200 is formed by repeatedly arranging a plurality of identical unit cells 201. Each unit cell 201 includes transparent pixels T and color pixels R, G, and B, which are the same as the transparent pixels T and the color pixels R, G, and B illustrated in FIG. 1.

In the example illustrated in FIG. 2, the unit cell 201 includes a 4×2 array. The 4×2 array includes 8 pixels arranged in four rows and two columns. For example, the unit cell 201 may include four rows r1, r2, r3, and r4 and two columns c1 and c2. Where a predetermined window 202 of 2×2 pixels is set in the unit cell 201, the window 202 may include one transparent pixel T and three different color pixels R, G, and B. Referring to FIG. 2, the window 202 includes one transparent pixel T, regardless of position, and three different color pixels R, G, and B regardless of its position in the color filter array 200.

Furthermore, referring to FIG. 2 again, each of the columns c1 and c2 in the unit cell 201 includes at least one transparent pixel T. For example, in the first column c1, a transparent pixel T may be positioned on the second row r2, and in the second column c2, a transparent pixel T may be placed on the fourth row r4. That is, the transparent pixel T appears at least once in each column c1 and c2 of the unit cell 201.

Therefore, the color filter array 200 which is designed to include the unit cells 201 arranged horizontally and vertically may improve the resolution and sensitivity of an image since each row of the color filter array 200 includes at least one or more transparent pixels T and any 2×2 array in the color filter array 200 includes both the transparent pixel T and the color pixels for obtaining light of three primary colors.

Figure 3:
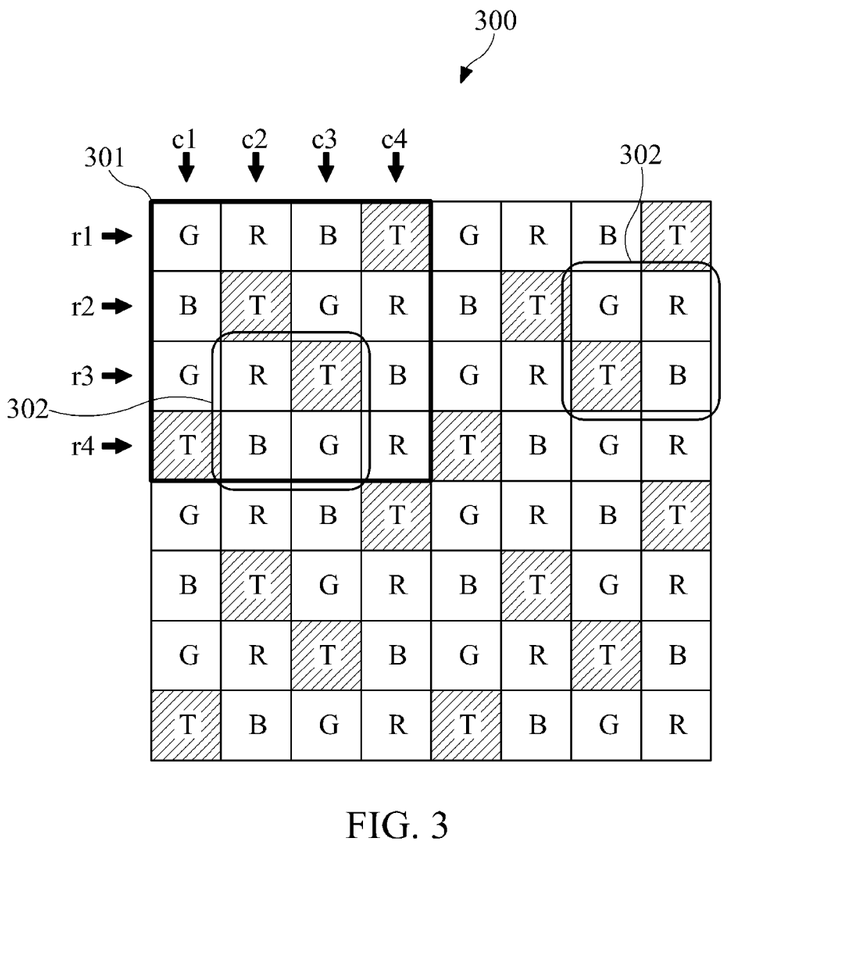
FIG. 3 is a diagram illustrating another example of a color filter array.

FIG. 3 illustrates another example of a color filter array. Referring to the example shown in FIG. 3, the color filter array 300 is formed by repeatedly arranging a plurality of identical unit cells 301. Each unit cell 301 includes transparent pixels T and color pixels R, G, and B, which may be the same as the transparent pixels T and the color pixels R, G, and B illustrated in FIG. 1.

In the example illustrated in FIG. 3, the unit cell 301 includes a 4×4 array. The 4×4 array includes 16 pixels arranged in four rows and four columns. For example, the unit cell 301 may include four rows r1, r2, r3, and r4 and four columns c1, c2, c3, and c4.

Wherever a predetermined window 302 of 2×2 pixels is set in the unit cell 301, the window 302 may include one transparent pixel T and three different color pixels R, G, and B. That is, regardless of its position in the color filter array 300, the window 302 includes one transparent pixel T and three different color pixels R, G, and B. The exception to this is when the window 302 is located on the center of the unit cell 301 or on the border between the unit cells 301. If the window 302 is placed at the center of the unit cell 301, the window 302 may include two transparent pixels T, and if the window 302 is placed on the border between the unit cells 301, only the color pixels R, G, and B may appear in the window 302.

Referring to FIG. 3 again, each of the rows r1, r2, r3, and r4 and the columns c1, c2, c3, and c4 in the unit cell 301 includes at least one transparent pixel T. For example, in the first row r1, a transparent pixel T may be positioned in the fourth column c4. In the second row r2, a transparent pixel T may be placed in the second column c2. In the third row r3, a transparent pixel T may be located in the third column c3. In the fourth row r4, a transparent pixel T may be placed in the first column c1. That is, the transparent pixel T appears at least once in each row r1, r2, r3, and r4 of the unit cell 301. In the same manner, in the first column c1, the transparent pixel T may be placed in the fourth row r4. In the second column c2, the transparent pixel T may be located in the second row r2. In the third column c3, the transparent pixel T may be located in the third row r3. In the fourth column c4, the transparent pixel T may be placed in the first row r1. That is, the transparent pixel T appears at least once in each column c1, c2, c3, and c4 of the unit cell 301.

Hence, the color filter array 300, which is designed to include the unit cells 301 arranged horizontally and vertically, may improve the resolution and sensitivity of an image since each row and column of the color filter array 300 includes at least one or more transparent pixels T and any 2×2 array in the color filter array 300 includes both the transparent pixel T and the color pixels for obtaining light of three primary colors.

In the examples illustrated in FIGS. 1 to 3, the color pixels are RGB pixels, but they are not limited thereto. The color pixels may be CMY pixels instead of the RGB pixels. Other pixel types may also be used. In addition, although the transparent pixel is described as a T pixel in the above examples, the transparent pixel may be a white pixel that passes and/or blocks infrared light.

Referring to FIGS. 1 to 3, the T pixel appears at least once in each row and/or each column of the color filter array 100, 200, and 300, and all of the R, G, and B pixels and the T pixel are included in any 2×2 array in the unit cell 101, 201, and 301. Therefore, where an image is captured by detecting light passing through the color filter array of the examples illustrated in FIGS. 1, 2, and 3, the sensitivity and resolution of the image may be improved using the light that has passed through the T pixel.

Figure 4:
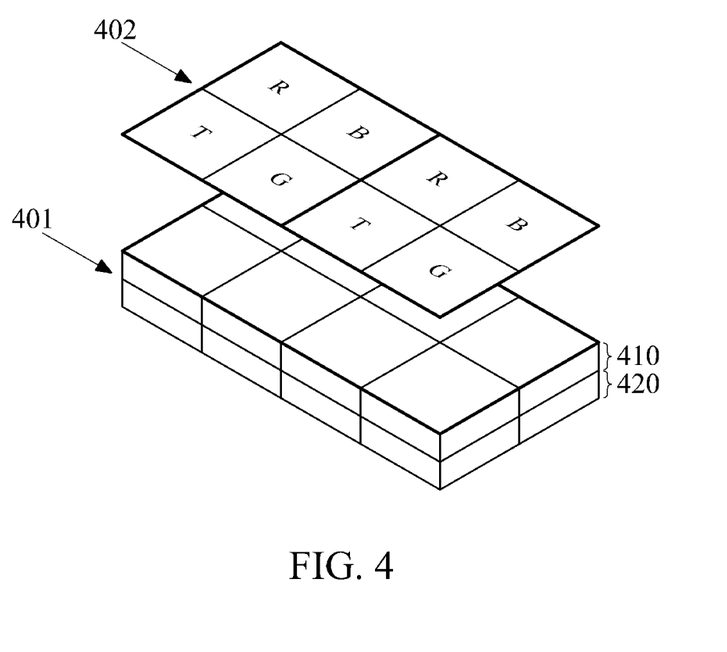
FIG. 4 is a diagram illustrating an example of an image obtaining apparatus.

FIG. 4 illustrates an example of an image obtaining apparatus. Referring to FIG. 4, the image obtaining apparatus 401 may detect light which has passed through a color filter array 402, and may generate an electrical image signal corresponding to the sensed light. The color filter array 402 may be the same as the color filter array 100 shown in the example illustrated in FIG. 1. The image obtaining apparatus 401 may be an image sensor such as a charge-coupled device (CCD) or a complementary metal-oxide semiconductor (CMOS).

In the example illustrated in FIG. 4, the image obtaining apparatus 401 may include at least two layers, which are a first layer 410 and a second layer 420. The first layer 410 detects light that has passed through an R pixel, a B pixel, or a G pixel, and generates a color signal corresponding to the detected light. Also, the first layer 410 may detect white light that has passed through a T pixel, and generate a white signal corresponding to the detected white light. The second layer 420 may detect infrared light from among light that has passed through the T pixel, and generate an infrared signal corresponding to the detected infrared light.

Figure 5:
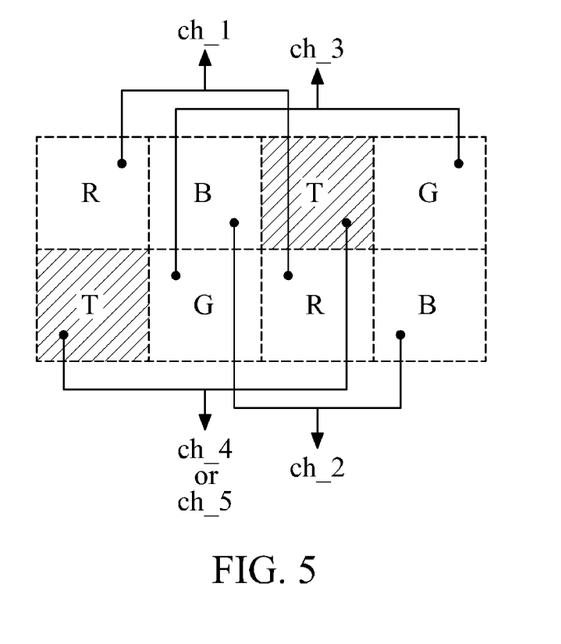
FIG. 5 is a diagram illustrating an example of a signal generated by the image obtaining apparatus illustrated in FIG. 4.

FIG. 5 illustrates an example of a signal generated by the image obtaining apparatus illustrated in FIG. 4. Referring to FIG. 5, the signal generated by the image obtaining apparatus 401 may include numerous sub-channel signals. For example, as shown in the example illustrated in FIG. 5, an image signal corresponding to light passing through the R pixel may be a first sub-channel signal. An image signal corresponding to light passing through the B pixel may be a second sub-channel signal. An image signal corresponding to light passing through the G pixel may be a third sub-channel signal. A white light signal which is generated by the first layer 410 (see FIG. 4) corresponding to the white light passing through the T pixel may be a fourth sub-channel signal. An infrared light signal which is generated by the second layer 420 corresponding to the infrared light passing through the T pixel may be a fifth sub-channel signal.

Where image processing is performed on each of the sub-channel signals and the image-processed sub-channel signals are combined to restore an image, an increase of the sensitivity and resolution of the image and reduction of noise may be achieved using the fourth sub-channel signal and/or the fifth sub-channel signal. For example, a color image may be created using the first, the second, and the third sub-channel signals and the sensitivity and resolution of the created color image may be enhanced using the fourth and the fifth sub-channel signals.

Figure 6:
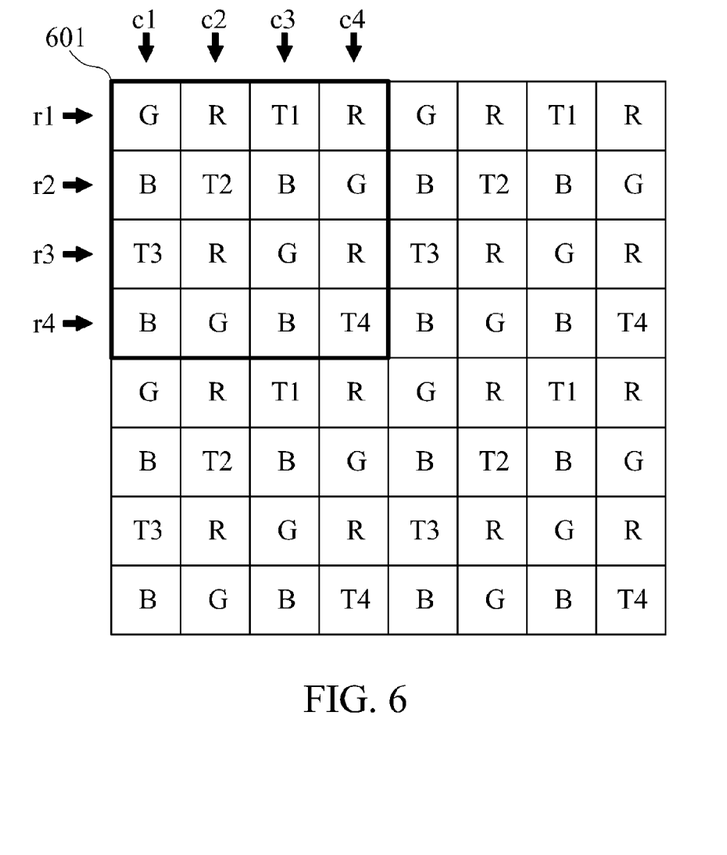
FIG. 6 is a diagram illustrating another example of a color filter array.

FIG. 6 illustrates another example of a color filter array.

Referring to the example shown in FIG. 6, the color filter array is formed by repeatedly arranging a plurality of identical unit cells 601. Each unit cell 601 has a 4×4 array structure including four rows and four columns. Each unit cell 601 includes transparent pixels T and color pixels R, G, B.

The number of transparent pixels T in each unit cell is 4. A first transparent pixel T1 is formed in the $3^{rd}$ column in the $1^{st}$ row (R1, C3) in each unit cell 601. A second transparent pixel T2 is formed in the $2^{nd}$ column in the $2^{nd}$ row (R2, C2) in each unit cell 601. A third transparent pixel T3 is formed in the $1^{st}$ column in the $3^{rd}$ row (R3, C1) in each unit cell 601. A fourth transparent pixel T4 is formed in the $4^{th}$ column in the $4^{th}$ row (R4, C4) in each unit cell 601.

The number of each color pixels R, G, B in each unit cell is also 4. In other words, a pixel ratio of each pixel T, R, G, B to the total pixels in each unit cell is all same. For example, the ratio of pixel T is 4/16. The ratio of pixel R is 4/16. The ratio of pixel G is 4/16. The ratio of pixel B is 4/16.

The term "pixel," as used herein, refers to a photo-element unit cell containing at least a photosensor for converting photons to electrical changes. The detector or photosensor of each pixel may be implemented, as nonlimiting examples only, as a pinned photodiode, a p-n junction photodiode, a Schottky photodiode, a photogate, or any other suitable photoconversion device or device that may accumulate and/or store photocharges.

The processes, functions, methods and/or software described above, including, but not limited to the signal processing architecture for processing each sub-channel signal, may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable media include magnetic media, such as hard disks, floppy disks, and magnetic tape; optical media such as CD-ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

As a non-exhaustive illustration only, the device described herein may refer to mobile devices such as a cellular phone, a personal digital assistant (PDA), a digital camera, a portable game console, and an MP3 player, a portable/personal multimedia player (PMP), a handheld e-book, a portable tablet and/or laptop PC, a global positioning system (GPS) navigation, and devices such as a desktop PC, a high definition television (HDTV), an optical disc player, a setup box, and the like consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer.

It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A color filter array, comprising:
at least one unit cell comprising a first transparent pixel located in a third column in a first row, a second transparent pixel located in a second column in a second row, a third transparent pixel located in a first column in a third row, and a fourth transparent pixel located in a fourth column in a fourth row.

2. The color filter array of claim 1, wherein the at least one unit cell further comprises color pixels, and a ratio of each color pixel to a total number of pixels is 1/4.

* * * * *